United States Patent [19]
Mansfield

[11] 4,115,730
[45] Sep. 19, 1978

[54] NUCLEAR MAGNETIC RESONANCE APPARATUS AND METHODS
[75] Inventor: Peter Mansfield, Chilwell, England
[73] Assignee: National Research Development Corporation, London, England
[21] Appl. No.: 785,448
[22] Filed: Apr. 7, 1977
[30] Foreign Application Priority Data
Apr. 14, 1976 [GB] United Kingdom .............. 15295/76
Jul. 20, 1976 [GB] United Kingdom .............. 30187/76
[51] Int. Cl.² ........................................... G01R 33/08
[52] U.S. Cl. .............................. 324/0.5 A; 324/0.5 B
[58] Field of Search .............. 324/0.5 R, 0.5 A, 0.5 B
[56] References Cited
U.S. PATENT DOCUMENTS

| 3,789,832 | 2/1974 | Damadian | 324/0.5 R |
|---|---|---|---|
| 3,932,805 | 1/1976 | Abe et al. | 324/0.5 A |
| 4,015,196 | 3/1977 | Moore et al. | 324/0.5 R |
| 4,021,726 | 5/1977 | Garroway et al. | 324/0.5 A |

Primary Examiner—M. Tokar
Attorney, Agent, or Firm—Cushman, Darby & Cushman

[57] ABSTRACT

A nuclear magnetic resonance spin density distribution in a sample is obtained for a selected plane or planes by placing the sample in a static magnetic field, applying a gradient to the field and simultaneously applying selective rf pulses to select a plane or planes in the sample, switching to an orthogonal gradient and simultaneously applying selective rf pulses to select strips in the selected plane or planes and then applying orthogonal field gradients to the sample of such relative magnitudes that each point of the selected strips is subjected to a resultant magnetic field of amplitude unique to that point. The free induction decay signal is then read out from the strips.

9 Claims, 27 Drawing Figures

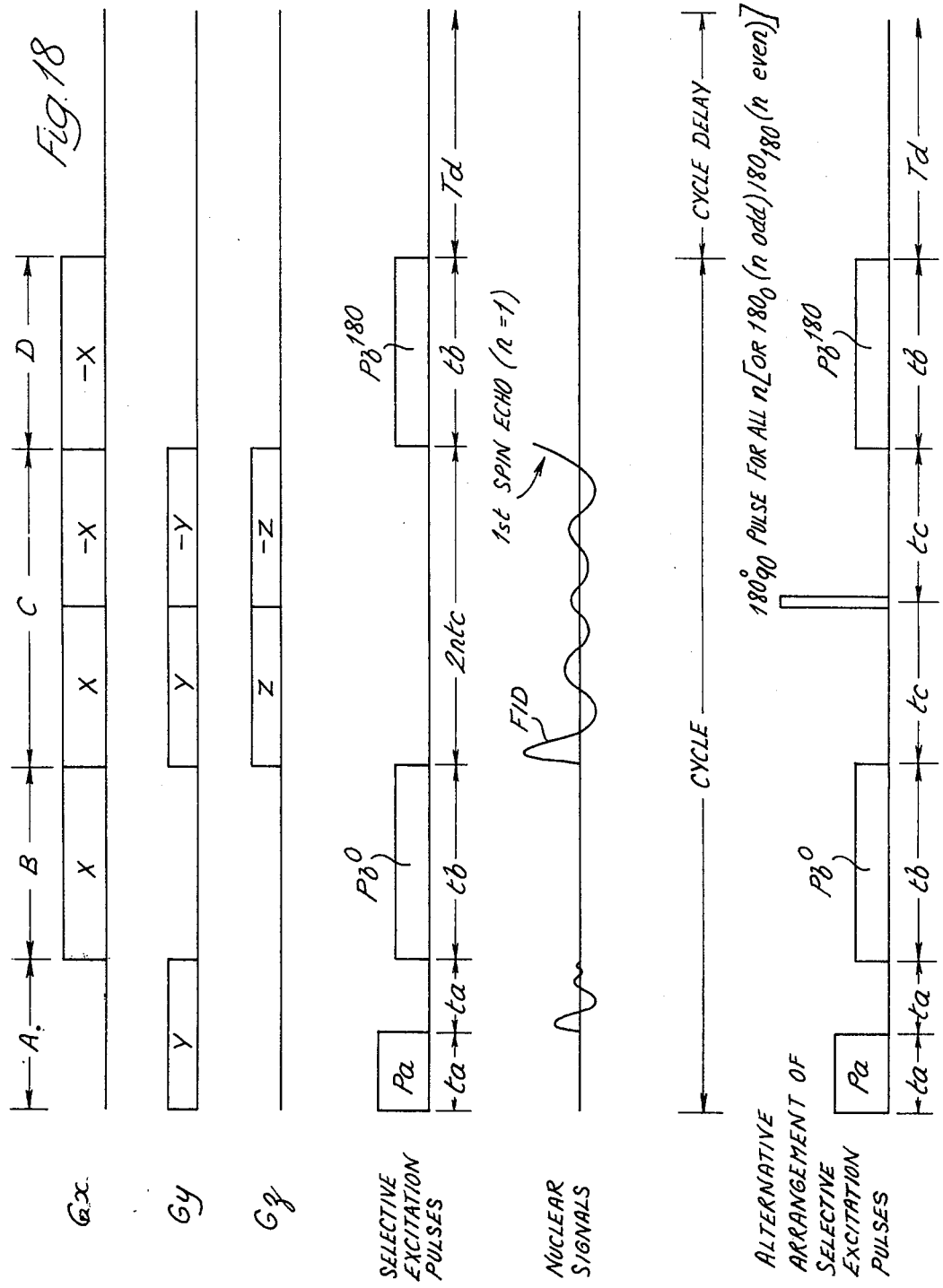

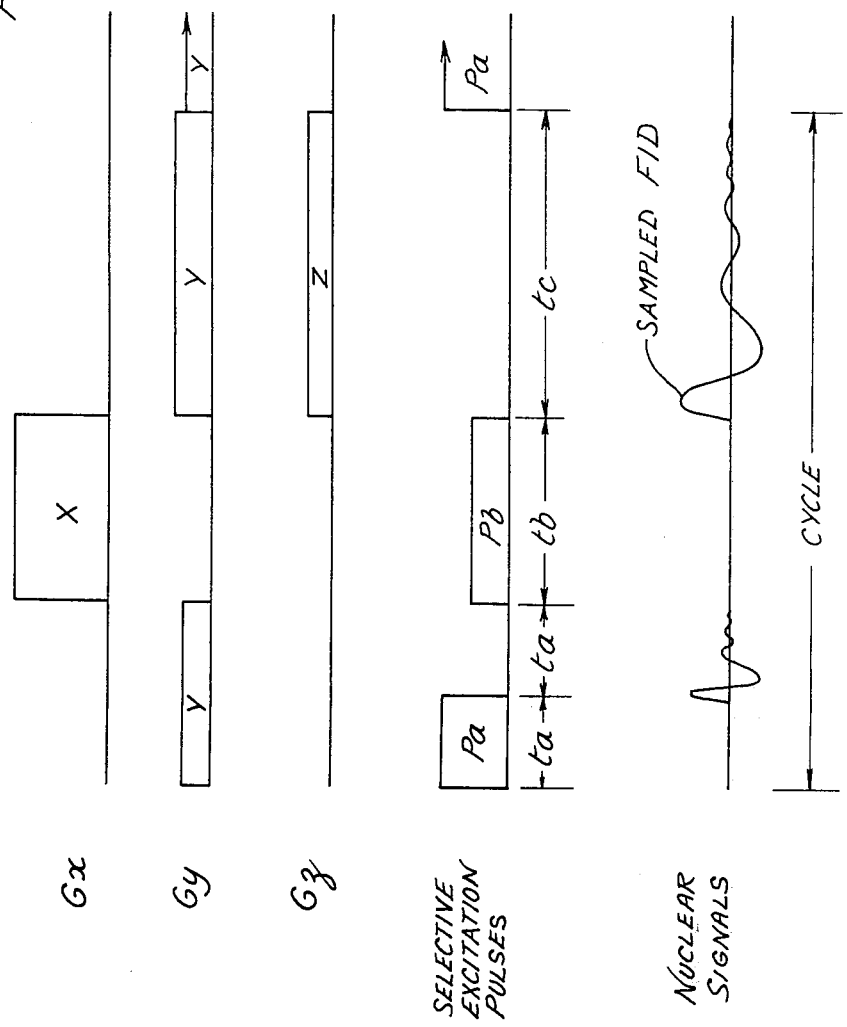

NUCLEAR MAGNETIC RESONANCE APPARATUS AND METHODS

This invention relates to nuclear magnetic resonance apparatus and methods. It is concerned with the formation of two and three dimensional images of the spin density distribution in material containing nuclear spins.

Of particular interest is the application of nuclear magnetic resonance (NMR) techniques to the study of biological material. Imaging by NMR techniques has clinical applications as a lower hazard alternative to X-rays for medical imaging in man since it is known that there are differences in spin lattice relaxation times between normal and malignant tissue.

Important factors that comprise a general quality factor for the image are spatial resolution, signal/noise ratio and the picture scan time. For a given imaging system, there is always some trade-off between signal/noise and scan time. In an ideal system, all information from the spin distribution would come in at a rate determined essentially by the experimenter and in this situation, the trade-off mentioned above would be straightforward. However, in practice it may not be possible to control the data input rate because of factors inherent in the imaging method itself. In addition, the information input may not be in a usable form, or it may take a considerable time to unravel the input or get it into a usable form.

Methods of imaging currently proposed attempt to reach the ideal but fall short in one sense or other. It is important at both microscopic and macroscopic extremes to get closer to this ideal situation, if NMR imaging is to be usefully applied.

In U.S. Pat. No. 4,021,726 there is described NMR apparatus comprising means for applying a static magnetic field to a sample along one axis, means for applying a magnetic field gradient along said one axis to said magnetic field which varies along said one axis, means for applying a gradient to said magnetic field along said one axis and which varies in at least one direction orthogonal to said one axis, means for applying radio frequency signals having selected frequency components to such sample to selectively excite a predetermined region of said sample to which a predetermined gradient has been applied, means for switching the said magnetic field gradients in sequence simultaneously with the application of said RF signals so as to preferentially excite only certain regions of the sample associated with said predetermined gradients and leave other regions effectively unexcited, and means for enabling the free induction decay signal from the sample to be read out.

As described in the above specification the apparatus functions to provide information from a read-out signal which relates to a single line through a sample and to obtain information from a complete plane or volume of a sample cyclic operations are necessary in which the sample is scanned successively along a sequence of lines.

In accordance with the present invention such information is derived systematically from a large number of selected small regions in a plane or volume whereby sufficient image information relating to an object is produced at one time to avoid the need for a scanning operation.

According to the present invention a method of obtaining a nuclear magnetic resonance spin density distribution of a sample comprises maintaining a static magnetic field along one axis, applying a first magnetic field gradient to said static magnetic field to cause said field to vary along an axis selected from said one axis and an axis orthogonal thereto and at the same time applying a selective excitation pulse so as to select at least one planar layer in the sample normal to the selected axis, removing said first magnetic field gradient and applying a second magnetic field gradient to said static magnetic field to cause said field to vary along an axis which is orthogonal to said selected axis and at the same time applying a selective excitation pulse to excite a series of strips in said at least one selected layer, and then simultaneously applying magnetic field gradients to said magnetic field to cause said field to vary in at least two of said orthogonal directions such that each point of the selected strips is subjected to a resultant magnetic field of amplitude unique to that point, and reading out the resulting free induction decay (FID) signal from said strips.

In order that the invention may be more fully understood reference will now be made to the accompanying drawings in which.

Figure 3:
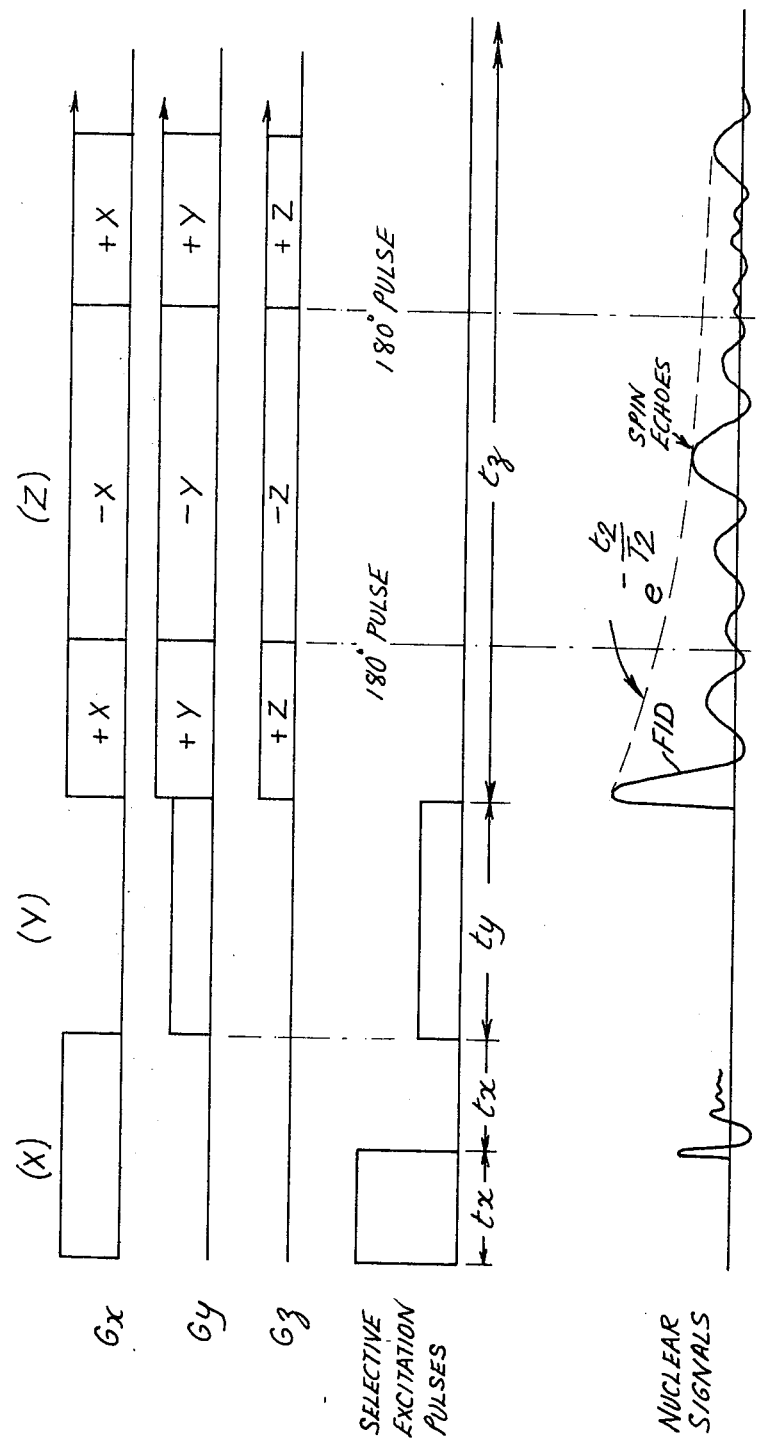
Figure 4:
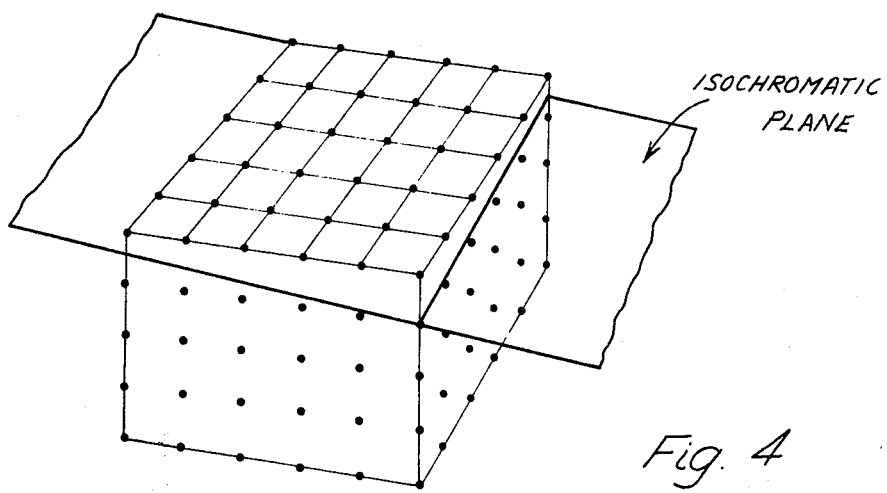
Figure 5:
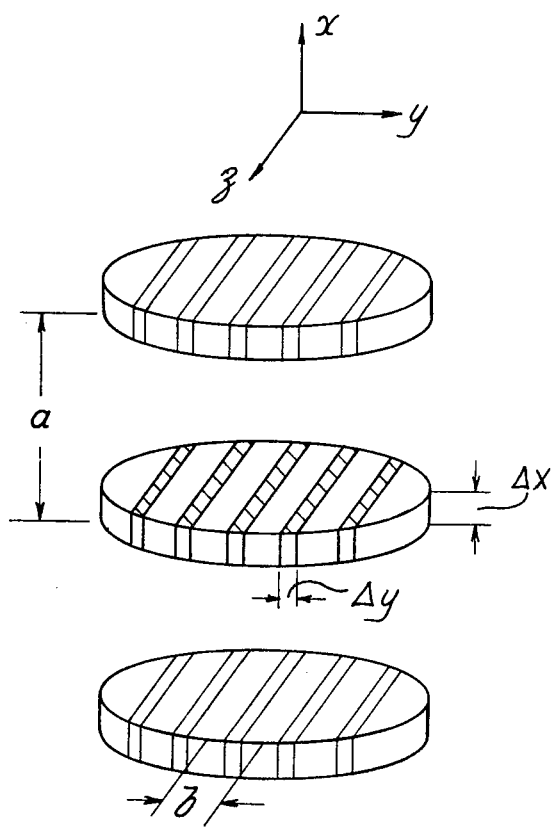
Figure 6A:
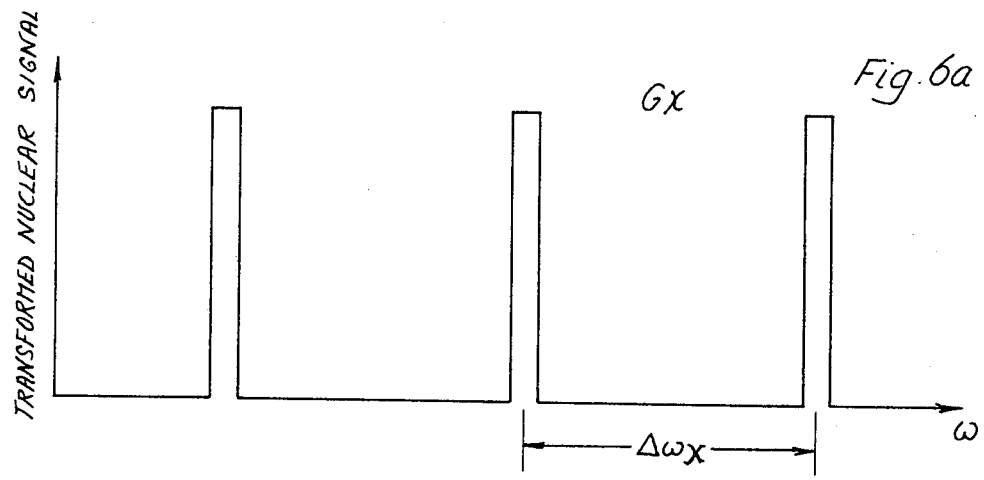
Figure 6B:
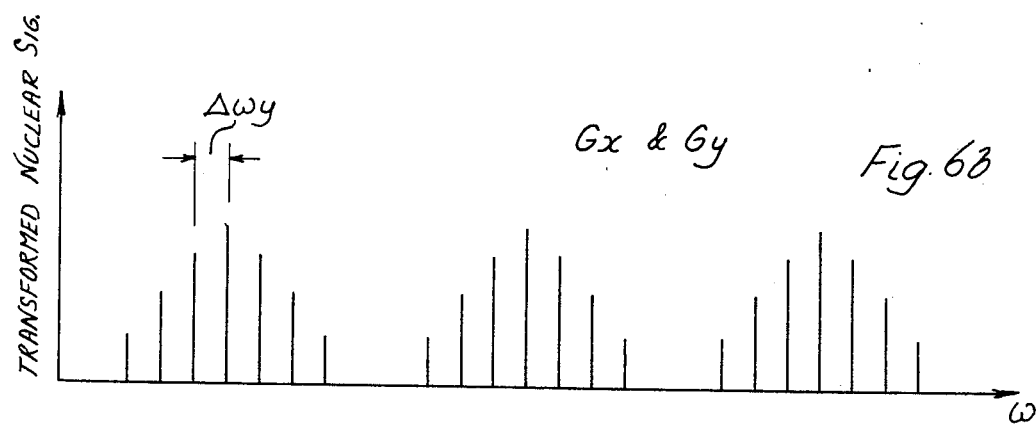
Figure 6C:
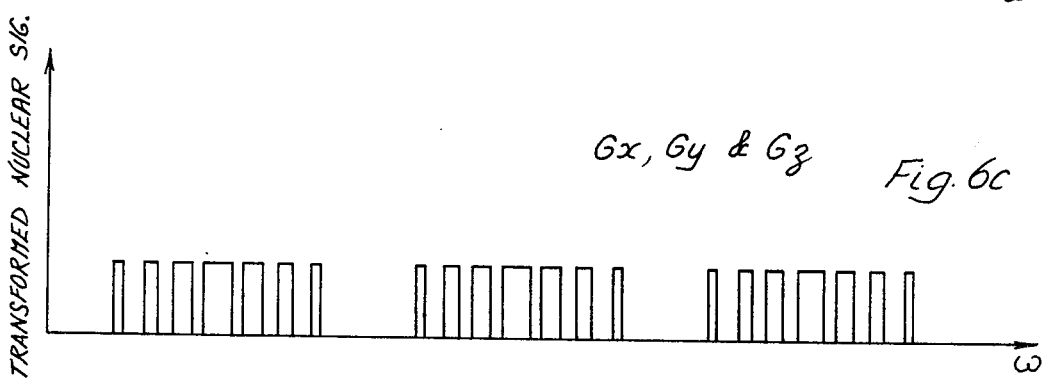
Figure 7:
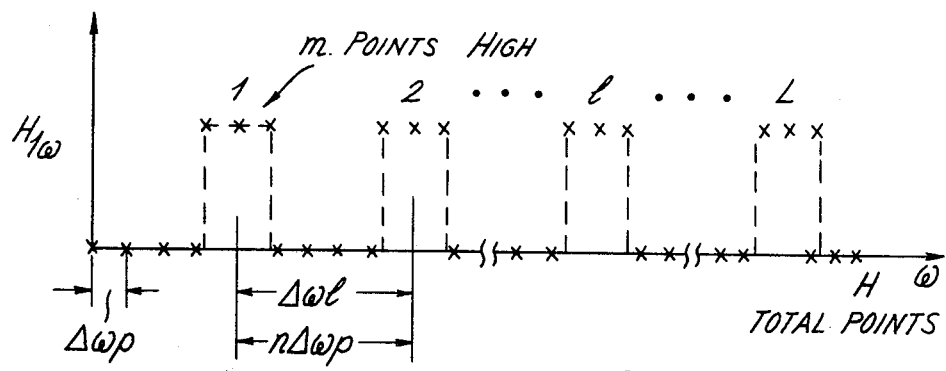
Figure 8:
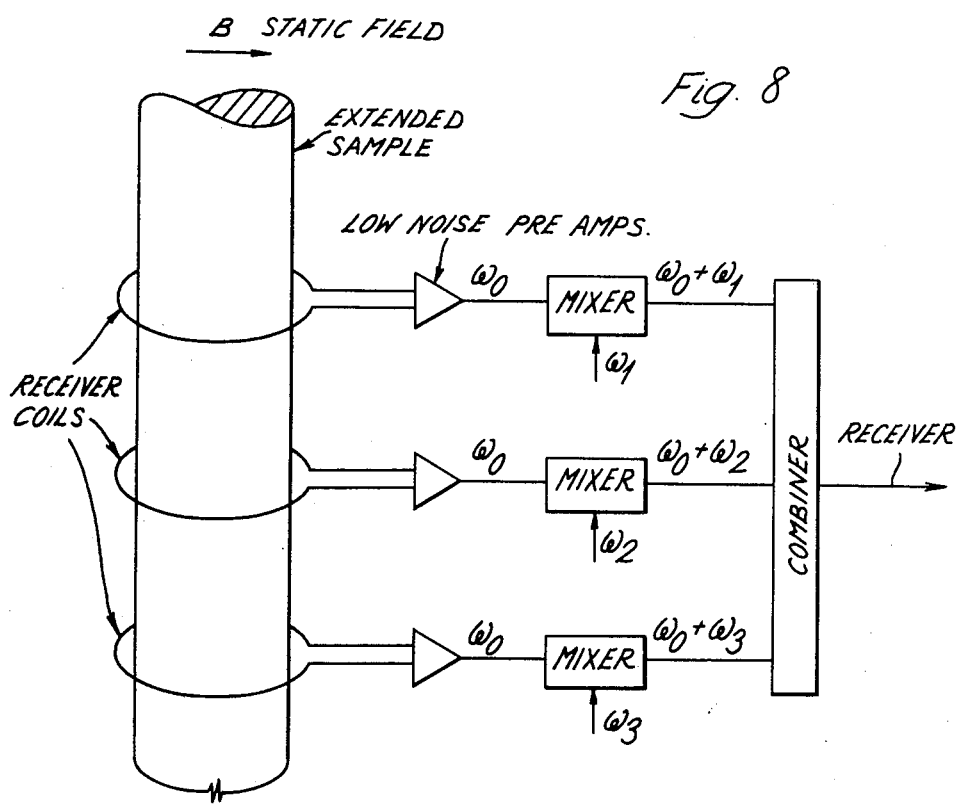
Figure 8A:
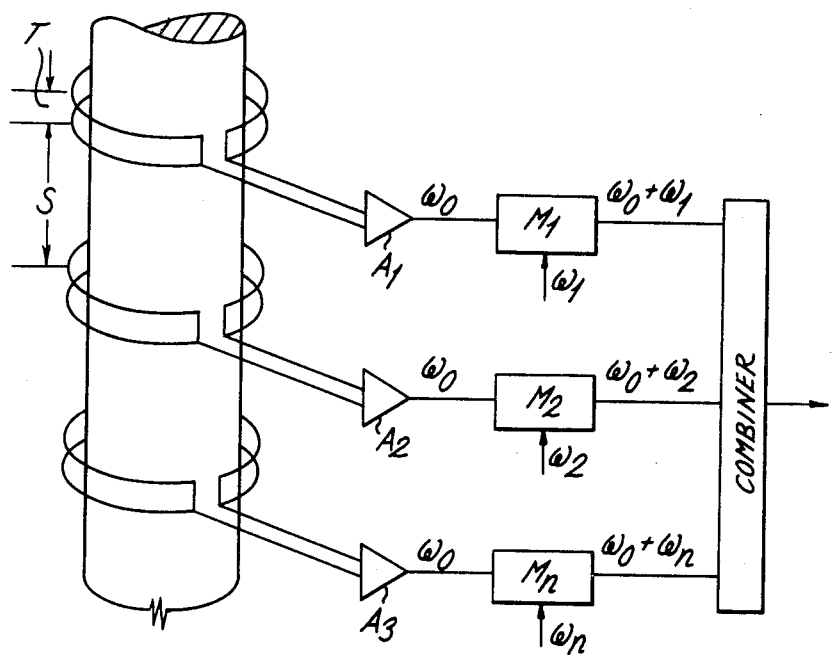
Figure 9:
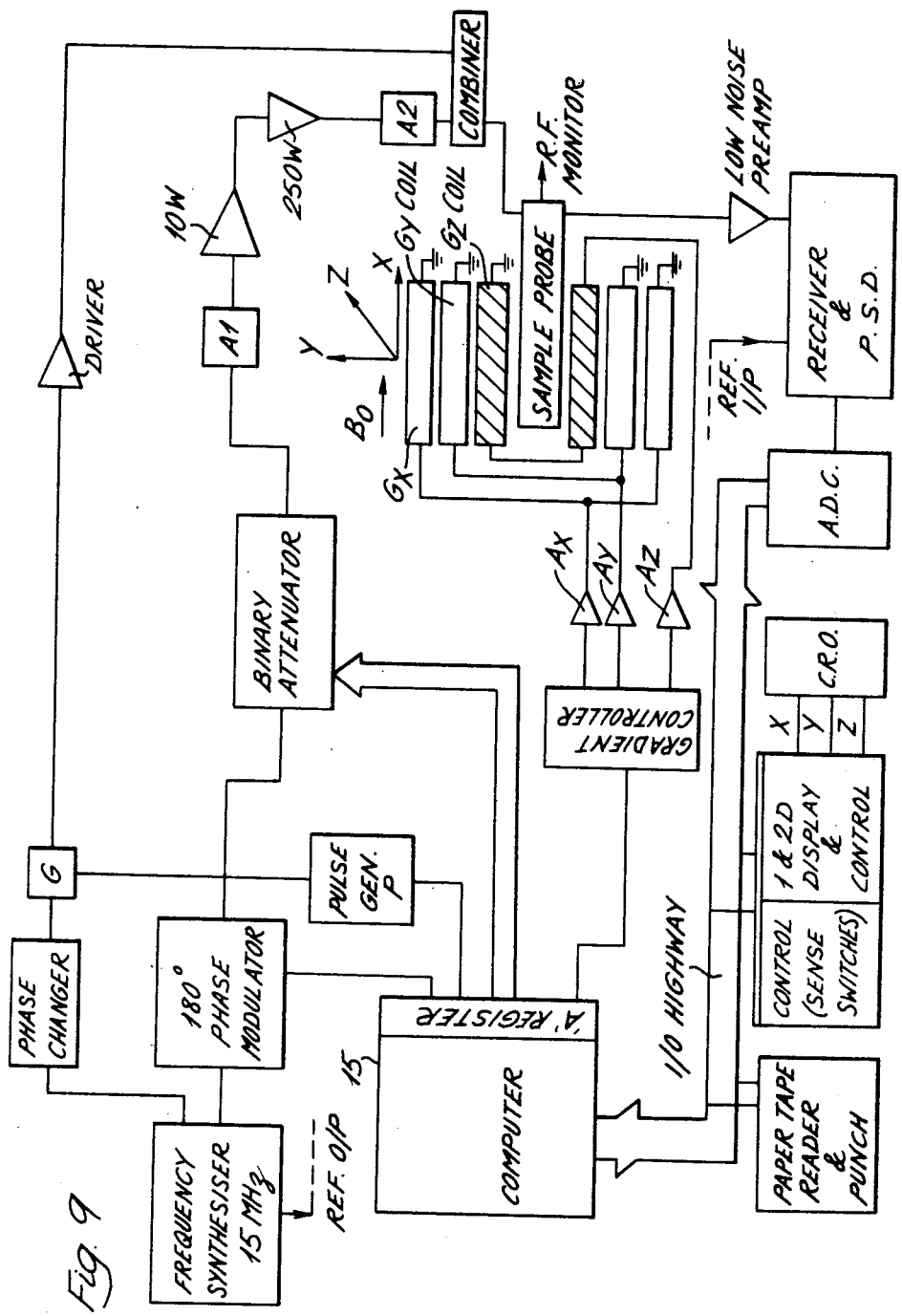
Figure 10:
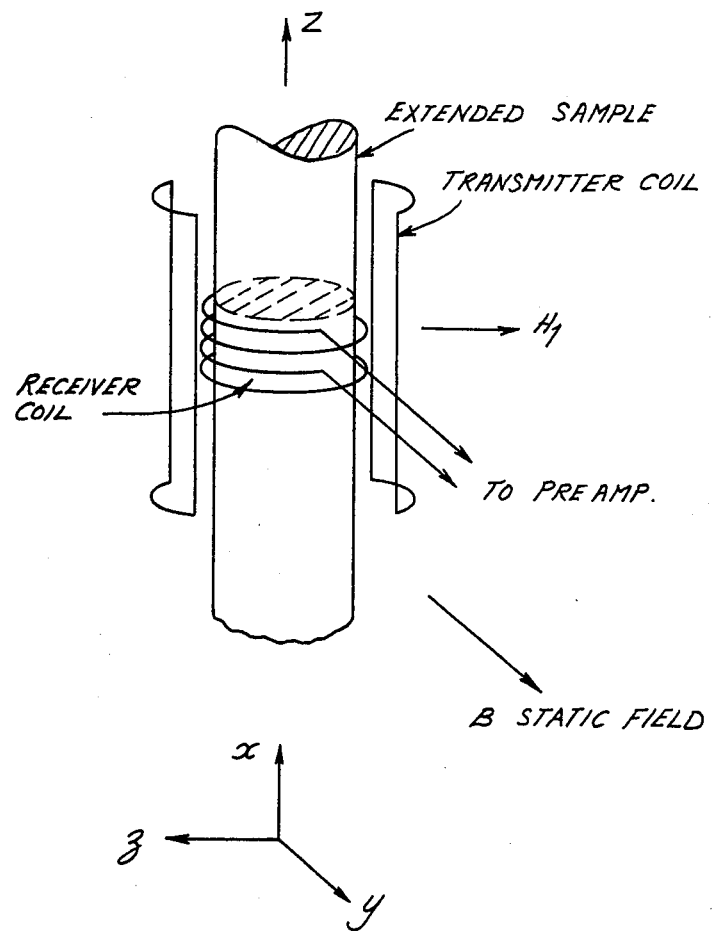
Figure 11A:
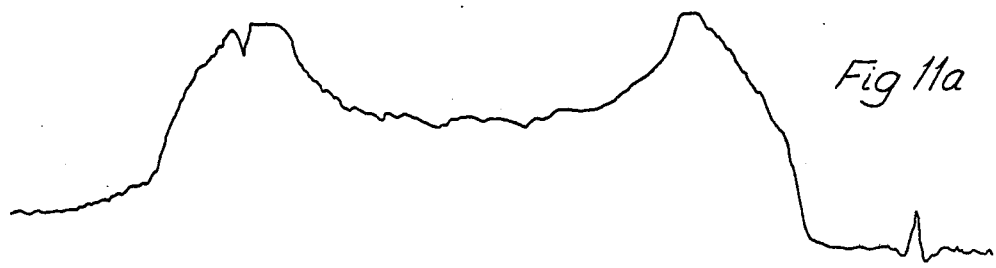
Figure 11B:
Figure 11C:
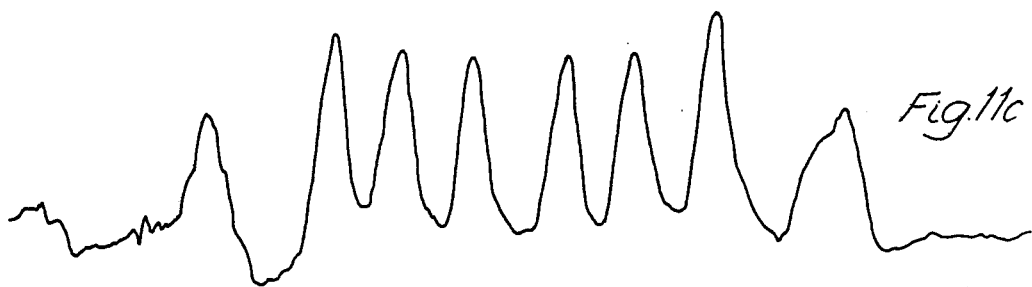
Figure 12:
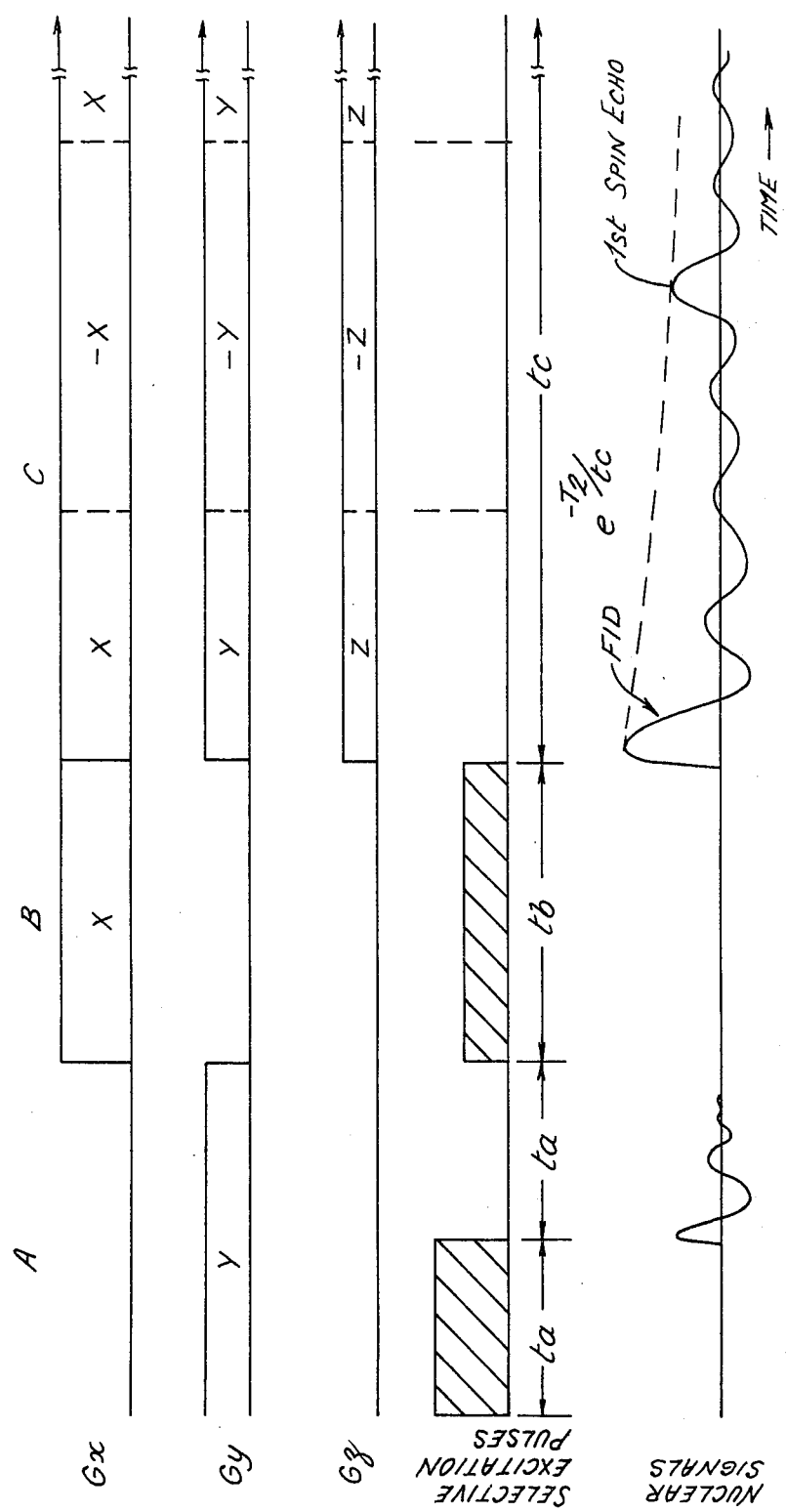
Figure 13:
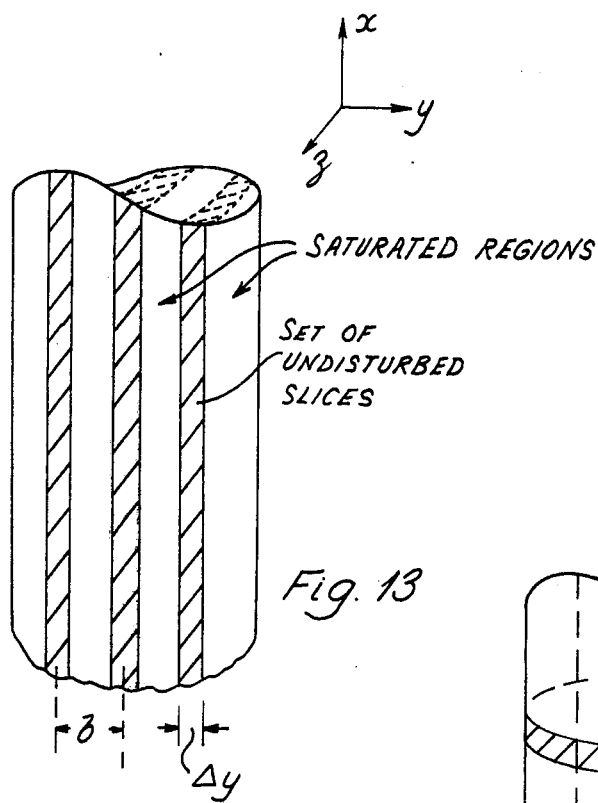

FIG. 3 shows waveforms of the excitation sequence and the resulting free induction decay (FID) signal envelopes, FIG. 4 is a diagram showing how an isochromatic plane can pass through a single point only in a regular finite lattice of points, FIG. 5 is a diagrammatic representation of three slices in a uniform cylinder, FIGS. 6a, 6b and 6c show signals obtained in successive magnetic field gradient combinations from the three slices of FIG. 5, FIG. 7 illustrates an example of the frequency spectrum of a tailored RF pulse sequence, FIG. 8 illustrates a set of receiver coils for obtaining signals from spaced apart slices, FIG. 8a illustrates an alternative arrangement of receiver coils to that shown in FIG. 8, FIG. 9 illustrates apparatus embodying the invention, FIG. 10 illustrates in detail an example of one receiver coil arrangement, FIG. 11 illustrates at (a) (b) and (c) successive signals obtained from a cylindrical annulus, FIG. 12 is a diagram showing an alternative switching sequence for 3 dimensional spin imaging, FIG. 13 is a diagram showing the initial saturated regions and undisturbed slices in a cylindrical sample in the first switching phase (A) of the sequence of FIG. 12.

Figure 14:
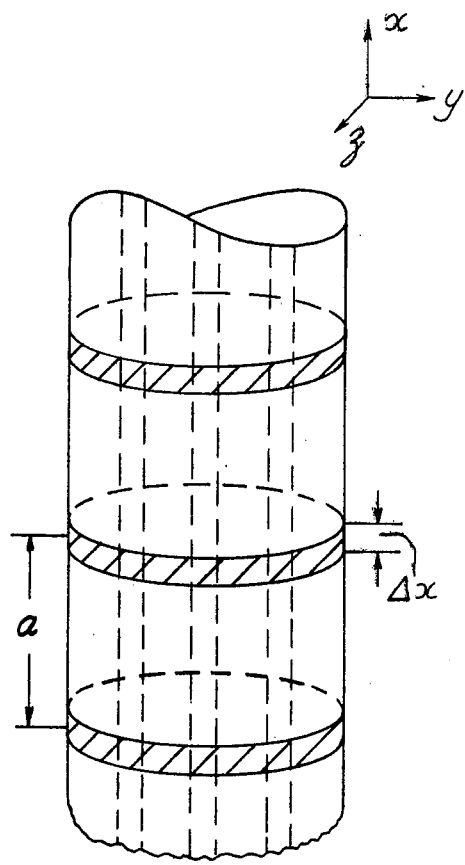
Figure 15:
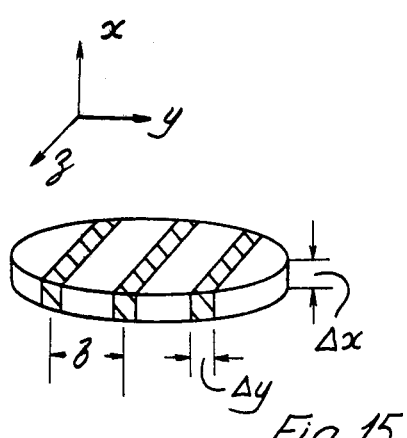

FIG. 14 is a diagram showing the disc-like regions of magnetisation selected in the second switching phase (B), FIG. 15 illustrates a single disc-like region in which the shaded strips correspond to the initially undisturbed regions in phase (A), FIG. 16 shows at (a), (b) and (c) Fourier transformed signals for various read gradients.

Figure 17A:
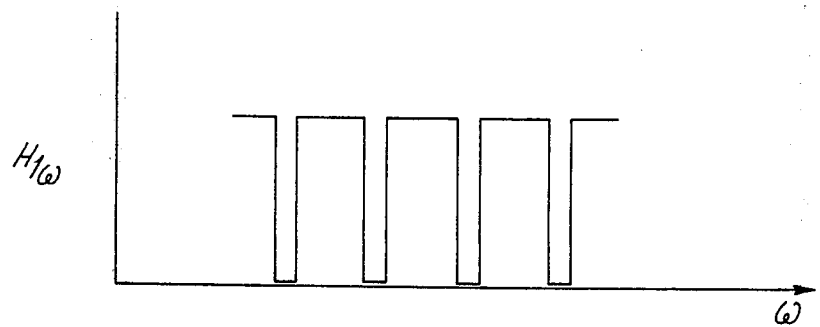
Figure 17B:
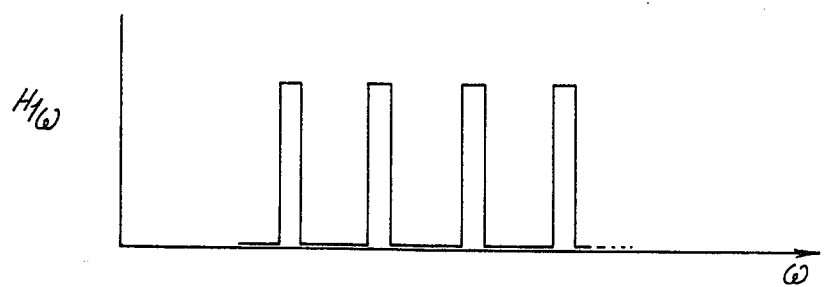

FIGS. 17a and 17b are diagrams of rf spectral distributions corresponding to the initial selective saturation pulse with FIG. 17a showing the desired distribution and FIG. 17b showing the complement of the desired distribution, FIG. 18 is a diagram of a switching sequence for multilayer 3-dimensional spin imaging enabling rapid cycling of the sequence, and FIG. 19 is an alternative diagram of a simpler switching sequence for single layer 3-dimensional spin imaging.

In one example of carrying out the invention a sample is placed in a static magnetic field $B_o$ which defines the $x$ axis of quantization of the nuclei. Three successive stages of irradiation and signal observation, designated (X), (Y), and (Z) then take place.

Figure 1:
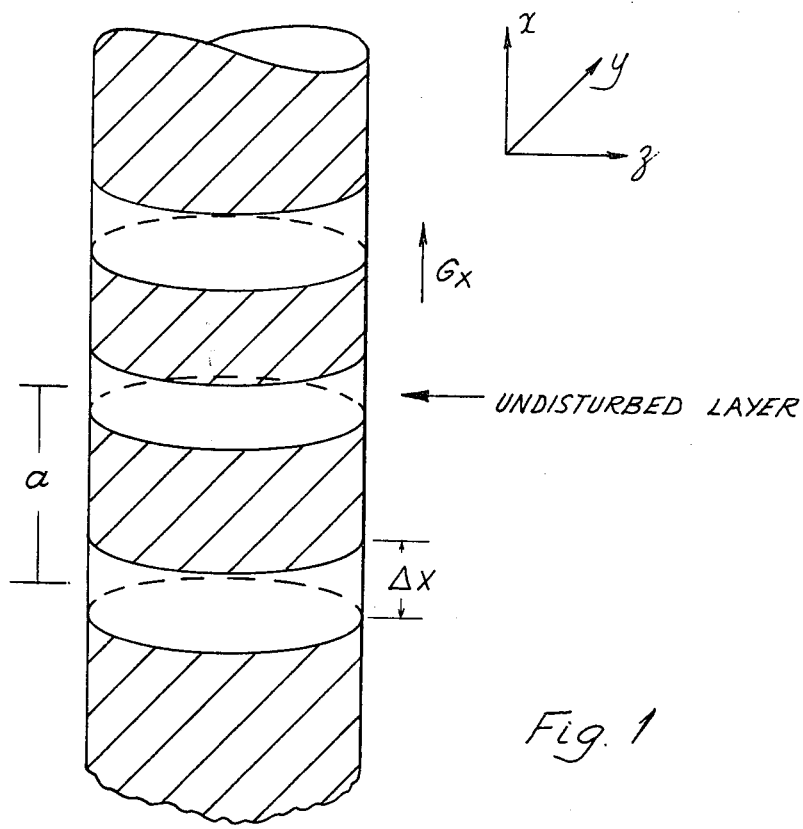
FIG. 1 illustrates a sample which is selectively excited so as to leave a set of spaced-apart planar layers undisturbed.

(X) This procedure closely follows the procedure set out in the above-mentioned applications. A field gradient $G_x$ is switched on and a selective excitation pulse applied so as to saturate the nuclear magnetization within the sample between a set of layers of thickness $\Delta x$ regularly spaced at $x = x_o + la$, ($l$ integer) from the origin with separation $a$, as shown in FIG. 1 where the shaded areas correspond to regions of saturated spin magnetisation. These layers comprise undisturbed spins in equilibrium with the static magnetic field $B_o$.

(N.B. Neither the thickness of the layers nor their spacing need be regular. The general undisturbed spin distribution is determined by the preparatory tailored pulse sequence.)

Figure 2:
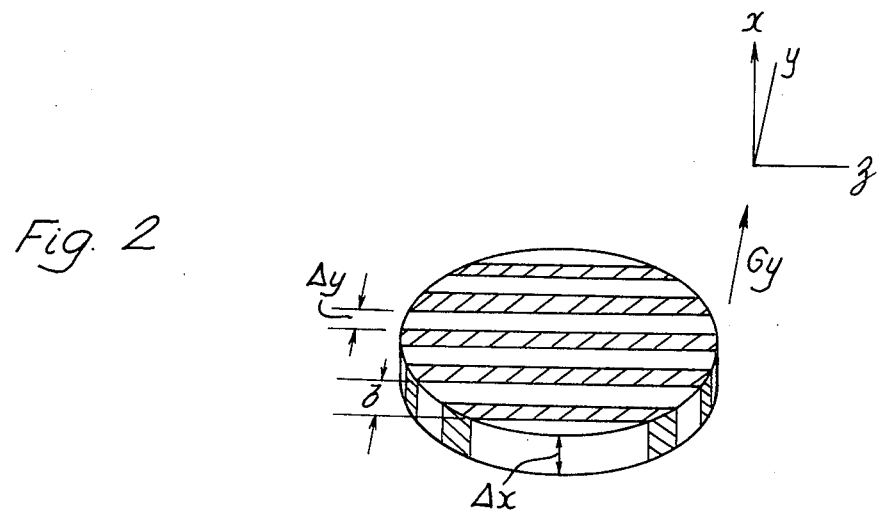
FIG. 2 illustrates one such layer in which a series of strips are selectively excited.

(Y) These layers of undisturbed spins are now concentrated on as shown in FIG. 2, which shows one undisturbed disc of the volume of FIG. 1. The gradient $G_x$ is quickly replaced by a new gradient $G_y$ along the $y$ axis, and a second selective excitation pulse is applied simultaneously to those spins lying in a grid of strips of width $\Delta y$ and grid spacing $b$ and which are shown shaded in FIG. 2.

(N.B. Neither the grid nor strip widths need be uniformly spaced, but can be selectively tailored to any desired distribution.) The excitation pulse referred to here can nutate the initially undisturbed spins through any angle $\theta$, but typically $\theta$ is 90°.

(Z) At the end of the (Y) excitation pulse, all three gradients are switched on so that the precessing spins experience the combined effect of $G_x$, $G_y$ and $G_z$. The free induction decay (FID) from all volume elements $m\Delta x \Delta yz$ spaced at $y = y_o + mb$ in the planes $x = x_o + la$ is observed and Fourier transformed to give a spin density distribution within the solid $\rho(x,y,z)$. When the initial FID has decayed, i.e. in a time $t_z = t_y$, the gradients $G_x$, $G_y$ and $G_z$ are reversed i.e. replaced by G-$x$, G-$y$ and G-$z$, thus causing the decayed signal to refocus as a spin echo. This procedure is unlikely to give additional echoes from the initially saturated spins in (X), and will work perfectly for two dimensional imaging when $G_x = 0$ in (Z).

(N.B. A 180° rf pulse can also be used to reform the signal instead of gradient reversal. This will work satisfactorily for two dimensional imaging in a plane; but for three dimensional imaging, the 180° pulse will affect the initially saturated spins in (X). However, this is unlikely to produce an extra echo for the same reason as in the case of gradient reversal, namely that the additional gradients $G_y$ and $G_z$ will tend to quench the formation of any echo. The timing of the pulse sequence also does not favour the formation of an observable signal.)

The successive reappearance of the nuclear signal can be achieved by cyclically reversing the field gradients in the sequence $$(\tau_{y,z} - 2\tau_{-y,-z} - \tau_{y,z})_N$$

where $\tau_{y,z} = t_y$ for gradient switching. The subscripts refer to the gradient directions i.e. along the $y$ or $z$ axis, during the interval $\tau$. Using 180° pulses a Carr-Purcell sequence is employed i.e.

$$(\tau_z - 180° - \tau_z)_N$$

All three magnetic field gradients will in general have different magnitudes.

The gradient refocussing can be continued until the FID is zero, i.e. until all magnetization has repolarized along the $x$ axis. In this way the useful signal observation time, as a function of the total available time, is $$\frac{2n \, t_y}{t_x + (2n + 1)t_y} = f$$

For large $n$, $f \to 1$. (N.B. repolarization of the spin system along $x$ is not affected by gradient switching but would be affected by 180° pulses which may have to be precise.)

The details of the switching sequence are shown in FIG. 3.

FIG. 3 shows the selective excitation sequence (X), (Y) and (Z) and the nuclear free induction decay (FID) signals and refocussed spin echoes following the pulses applied in steps (X) and (Y). The magnetic field gradients are periodically reversed (denoted by $-X$, $-Y$ and $-Z$) to produce a train of spin echoes. The spin echo peaks decay exponentially with time constant $T_2$. Fixed gradients and 180° pulses are an alternative arrangement. In these experiments only the nuclear signal in time $t_z$ is sampled. One initial selection pulse in (X) and one plane scan pulse in (Y) are all that is required per sequence. The process can be written as a cycle.

$$(X, Y, Z(n))_{repeat}$$

where the total time period of $Z(n)$ can be varied for spin-lattice relaxation time mapping studies.

Application of a magnetic field gradient to a three dimensional or even two dimensional continuous distribution of spins will not ordinarily allow all elements of the distribution to be uniquely assigned magnetically. However, if they could be uniquely assigned then the "absorption" line shape would in a single trace reveal the entire spin density distribution.

By a process of selective irradiation, a discrete lattice structure can be superimposed on the otherwise continuous spin distribution. That is to say, it can be arranged that only those spins lying on a well defined lattice structure are observed, the dimensions of which are controlled by selective excitation, etc.

For a given orthorhombic lattice, it is easy to show that all points can be uniquely assigned a definite frequency by application of one appropriately chosen gradient only, see FIG. 4, which is a diagram of an isochromatic plane passing through one point in a regular finite lattice. The plane is produced by the action of three orthogonal field gradients. This process thus gives spot (point) checks, as it were, of the entire three dimensional spin-density distribution. Spins between lattice points do not contribute. Enlargement of the points to include surrounding spins imposes constraints which may make it easier to look at a single plane, or a selected few planes, rather than the entire three dimensional object. This may also be desirable from a data handling and storage point of view.

The initial selection and preparation of the spin system in the period (X) involves the gradient $G_x$ and r.f. pulses which nutate some of the spins through 90°. Precisely which spins are effected will depend on the magnitude of the field gradient and the spectral distribution of the perturbing tailored r.f. pulse.

For simplicity the combined effects of such a tailored pulse and field gradient may be represented by a spatially selective operator $(1-\hat{S}_x)$. If the spin density distribution is $\rho(xyz)$ then $\hat{S}_x\rho(xyz)$ represents the undisturbed spin distribution while $(1-\hat{S}_x)\rho(xyz)$ is the distribution of spins which receives a 90° nutation pulse. In a similar manner, a second spatially selective operator $\hat{S}_y$ is introduced which selects all the spins nutated through 90° by the combined action of the second tailored excitation pulse and the new field gradient $G_y$.

Neglecting multiplicative constants, let the initial equilibrium density matrix of the spin system, (spin I), in the high temperature approximation, and distributed in volume $v$ be $$\sigma(o) = \int \delta_o dv \qquad (1)$$

where $\delta_o = \sigma(xyz)I_x$. The z component of the transverse response signal in the rotating reference frame and at the time $t$ is given by
ti $S_z(t) = T_r\{\sigma(t) I_z\}$ \qquad (2)

where $Tr$ is the trace or diagonal sum.

After the first 90° pulse, the density operator describing the spin system at time $t_x + t$ becomes $$\delta_1(t_x+t) = \hat{S}_x\rho(xyz)I_x + (1-\hat{S}_x)\rho(xyz)e^{i\gamma xG_x I_x t}I_z e^{-i\gamma xG_x I_x t} \qquad (3)$$

The second term in Eq. (3) will give a transverse signal which quickly decays in $t_x$. Following the second 90° rf. pulse, the density operator at time $2t_x + t_y + t$ becomes $$\hat{\delta}_2(2t_x + t_y + t) = \tilde{\delta}_1 \exp(i\gamma t I_x [xG_x + yG_y + zG_z])$$
$$\tilde{\delta}_1(2t_x) \exp(-i\gamma t I_x [xG_x + yG_y + zG_z]) \qquad (4)$$

where the tilde on $\tilde{\delta}_1$ means that $I_x$ is replaced by $I_z$ and $I_z$ by $-I_x$ in $\delta_1$.

It is straightforward to show by expanding Eq. (4) and substituting into Eq. (2) that the only significant non-vanishing signal following $t_y$ at time $t$ is $$S(xyzt) = \int \hat{S}_y \hat{S}_x \rho(xyz) \cos \gamma [x\,G_x + yG_y + zG_z] t dv \qquad (5)$$

A non-interacting spin system has been assumed throughout which evolves during selective irradiation as though the rf. pulse were a pure 90° rotation operator. No spin echo is expected following the second tailored 90° pulse since the field gradient change from $iG_x$ to $G$ will in general suppress it, except for those spins lying in a line along $x$ corresponding to the magnetic centres of the gradients $G_y$ and $G_z$, i.e. when both $y$ and $z$ are both zero in Eq. (5). These spins are likely to give a very small echo signal which we entirely ignore in this analysis.

In these experiments the selection processes embodied in the operators $\hat{S}_x$ and $\hat{S}_y$ correspond not to single layers of material, but multiple layers. The experiments are further specialized to equally spaced layers of thickness $\Delta x$, strip width $\Delta y$ and point length $\Delta z$ (set by sampling) and spatial periodicity $a,b,c$. In the limit that the undisturbed spin ranges $\Delta x$, $\Delta y$ approach zero, and for discrete sampling of the distribution along $z$, $$\hat{S}_x\hat{S}_y\hat{S}_z\rho(xyz) \rightarrow \rho(la, mb, nc) = \rho_{lmn} \qquad (6)$$

where $lmn$ is an integer and where $S_z$ is the spatial sampling operator. The effective density, therefore, becomes a discrete distribution $\rho_{lmn}$ corresponding to the lattice points $x = al$, $y = bm$ and $z = cn$. In this limit, therefore, the signal, Eq. (5) becomes $$S_{lmn} = \Sigma\eta_{lmn} \cos t \,[l\Delta\omega_x + m\Delta\omega_y + n\Delta\omega_z] \qquad (7)$$

where the number density $$\eta_{lmn} = \rho_{lmn} \Delta v \qquad (8)$$

and $\Delta v$ is the volume of spins at a lattice point contributing to the signal, and is assumed to be constant for all points. The angular frequency increments are given by $$\Delta\omega_x = \gamma\, a\, G_x, \text{ etc.} \qquad (9)$$

from Eq. (7) it can be seen that if the gradients and lattice constants are chosen so that $$N\,\Delta\omega_z \leq \Delta\omega_y \leq \Delta\omega_x/M \qquad (10)$$

where M and N are the largest values of $m$ and $n$ respectively. All points in the distribution $\rho_{lmn}$ are uniquely defined in the frequency domain although the above refers to superimposing a regular lattice by selective irradiation and sampling, this is true for a natural orthohombic lattice. Fourier transformation of $S_{lmn}$ together with the Fourier transform nesting procedure described above, effectively turns a two or three dimensional transform into one that is one dimensional, thus allowing the determination in one calculation of the complete three dimensional distribution function $\rho_{lmn}$.

The requirement that all points in the object be simultaneously resolved is more stringent along the z axis. If there are $n$ points spaced $c$ apart, and each point has an extent $\Delta z$, , then the condition for linearity of the z gradient is $$\Delta z/Nc = \Delta G/G_z \qquad (11)$$

where $\Delta G$ is the deviation of $G_z$ from uniformity. In addition the natural line width of the resonance $\Delta\omega_{nat}$ in the static field (which includes static field inhomogeneity, relaxation effects, diffusion in the gradient and bulk broadening effects of the sample), must satisfy the relationship $$\Delta\omega_{nat} \leq \Delta z\, G_z \qquad (12)$$

Of course, this stringency arises only if one wishes to put more information in a given bandwidth in the frequency domain. If the frequency per point along z is the same as in the line scan method then the requirements of both the z gradient coil and the natural linewidth, and hence the static field, are exactly the same.

On the other hand, if data is compressed into a narrow frequency band, it creates higher demands on the uniformity of both the gradient coils and static magnet. The advantage is a narrower bandwidth per picture point giving an increased signal/noise ratio.

The presentation and read-out of data is perhaps best illustrated with a simple example of a three dimensional image of a cylinder of mobile spins (water). In FIG. 5 there is shown by way of example three layers of a sample each of thickness $\Delta x$ in the $x$ direction spaced apart by distances $a$. Each layer is divided into grids of thickness $\Delta y$ in the $y$ direction spaced apart by distances $b$. The spacings $a$ and $b$ and the thickness $\Delta x$ and $\Delta y$ are determined by the selective irradiation parameters. In the period (X), the layers of undisturbed spin magnetization are prepared by selective irradiation in a magnetic field gradient $G_x$. In the period (Y), a set of uniformly spaced strips within all layers is excited with $G_y$ only switched on. The FID following this (Y) selection can be read in $G_x$ alone. In this case, all spins within a layer are undifferentiated, but of course the layers are differentiated so the Fourier transform would simply be (for three layers, as in FIG. 5), three equal amplitude spikes.

The Fourier transformation signals for a cylindrical sample of homogeneously distributed spins prepared by the selective irradiation procedure of FIG. 5 is shown in FIG. 6. FIG. 6a shows such signal with a read magnetic field gradient equal to $G_x$ only showing three equal lines corresponding to the signals from the three discs of magnetization of FIG. 5. However, if read-out were done with $G_x$ and $G_y$ on, and in such a way that the condition in Eq. (10) is satisfied, namely that $\Delta\omega_x \geq M\Delta\omega_y$, then the spectrum in FIG. 6 (b) is obtained which shows each of the three lines of FIG. 6 (a) split by the addition of the magnetic field gradient $G_y$. The discrete profile corresponds to the projection of the spin density distribution of the disc along the $y$ axis. Finally, if the read-out is performed in all three gradients $G_x$, $G_y$ and $G_z$ satisfying condition, Eq. (10) one would expect a discrete lineshape of constant amplitude, as indicated in FIG. 6 (c).

The addition of the third orthogonal magnetic field gradient $G_z$ broadens each line of the discrete spectrum of FIG. 6 (b). Each element is ideally rectangular with width varying across the specturm as indicated and represents a cross-sectional profile of each strip within the layer.

Unlike line scan imaging the tailored rf. pulse sequences in these experiments have a multiple discrete spectral distribution as illustrated in FIG. 7 for the special cases of (a) rectangular spectral profiles and (b) uniform amplitude. That is to say, instead of scanning line by line, the entire object is irradiated at the same time.

(N.B. In certain cases, it is possible to compensate for r.f. inhomogeneity in the transmitter coil system by changing the spectral profile from a constant amplitude to something which varies with frequency in the desired manner).

For a multiple discrete rf. spectral distribution of L components with constant amplitude $H_{1\omega}$ individual constant width $2m\Delta\omega_p$ ($m$ integer) and with the centre frequency of each component separated by $\Delta\omega_l = n\Delta\omega_p$, the time domain pulse must be shaped according to the expression $$H_1(t_n) = H_{1\omega} m \Delta\omega_p \text{ sinc } (\Delta\omega_p n t_n) \sum_{0}^{L} e^{i(l\Delta\omega_p t_n)} \quad (13)$$

In this expression, the angular frequency per point is given by $$\Delta\omega_p = 2\pi/N\tau \quad (14)$$

in which N is the total number of points in the time domain and $\tau$ their spacing.

Of course, if an additional frequency offset is added so that image fields are non-secular as far as the resonant spins are concerned (i.e. outside the range of frequencies produced by the field gradient), then we take the real part of the expression and simply compute the cosine transform.

Equation (13) gives the initial r.f. pulse amplitude $$H_1(O) = 2\pi L m H_{1\omega}/N\tau \quad (15)$$

where $H_1(O)/L$ m is the field amplitude used to calculate the 90° pulse condition for each irradiated point.

The condition for magnetic uniqueness, expression (10) was derived for point regions of spins within a general three dimensional object. The finite volume of the sample at the lattice sites does however have an effect.

If the elemental volume at the lattice site is $dv = \Delta x \Delta y \Delta z$ then additional constraints on the size of this volume and the magnitude of the gradients arise if all points are to be simultaneously resolved. In this case the inequality, expression (10) is modified and becomes $$\delta\omega_x + \delta\omega_y + N\Delta\omega_z \leq \Delta\omega_y \leq 1/M [\Delta\omega_x - \delta\omega_x - \delta\omega_y] \quad (16)$$

where $\delta\omega_x = \Delta x G_x$ and $\delta\omega_y = \Delta y G_y$.

The effect of the additional contributions to the signal when the discrete lines of the r.f. spectral distribution during selection have a finite width are now considered. When these lines are delta-function-like in frequency space, and well resolved from each other, two gradients are obtained with unambiguous cross-sectional profiles, as described with reference to FIG. 6.

Suppose now that we do not have delta functions, but a set M of broad spikes or even rectangular spectral distributions (FIG. 7) which in one gradient $G_y$ produce the discrete density projection profile $f_m(\omega_{mq})$ along the $y$ axis. The $m$th mth spike or rectangle can be regarded as being made up of a closely spaced set $q$ of delta functions, each one of which would broaden in combined gradients $G_y$ and $G_z$ to yield the $z$ axis density function $\rho_z^{mq}(\omega_{mq})$. Thus over the subset $q$ the observed profile will be a broadened, smeared function $\Gamma_m(\omega_{mq})$ which is the weighted sum of individual functions, i.e. the convolution like function $$\Gamma_m(\omega_{mq}) = \sum_{q'}^{mq'} \rho_z (\omega_{mq'}) f(\omega_{mq'} - \omega_{mq}) \quad (16a)$$

We note that unlike the ordinary convolution function the broadening function $f_m(\omega_{mq})$ varies in general with $m$ across the projection.

For a closely spaced subset, Eq (16a) reduces to $$\Gamma_m(\omega) \to \int \rho_z^m(\omega') f_m(\omega' - \omega) d\omega \quad (16b)$$

where the discrete variables $\omega_{mq}$ and $\omega_{mq'}$ are replaced by the continuous variables $\omega$ and $\omega'$.

For a set of well resolved spikes (or ideally, delta functions) where the extent of the additional broadening produced by $G_x$ does not overlap, we get from Eq (16b)

$$\Gamma_m(\omega) = \rho_z^m(\omega) \quad (16c)$$

This is the result already obtained (FIG. 11) and illustrated in FIG. 6. But Eq (16a) also allows evaluation of $\rho_z^{mq}(\omega_{mq})$ when $f(\omega)$ is not a delta function provided the $m$th cross-sectional profile does not change significantly with $q$ i.e. if we replace $\rho_z^{mq}(\omega_{mq})$ by $\rho_z^m(\omega_{mq})$ which corresponds to a high degree of short range spatial correlation. In this case Eq (16b) is a localized convolution integral. The function $\rho_z^m(\omega_{mg})$ can be obtained directly from the Fourier transform of $\Gamma_m(\omega_{mq})$ and the localized projection profile $f_m(\omega_{mq})$ without the additional broadening of $G_x$.

The procedure for single planar images for example, is thus first to measure the discrete projection profile in $G_y$ alone. Next the broadened profile is recorded in both gradients $G_y$ and $G_z$. Each discrete section of both profiles is inversely Fourier transformed to the time domain and the broadened signal is divided by the corresponding unbroadened signal computed at zero frequency offset. The quotient is then Fourier transformed back to the frequency domain and the resulting signal represents the true density profile along the $z$ axis.

So far the localized, broadened lines have been considered as resolved. This leads to unambiguous determination of the specimen cross sectional profiles via a localized deconvolution. Thus better precision is available is required, from a given data set.

If all the lines merge so that there is no localized resolution, can the profiles $\rho_z^m(\omega)$ still be determined? There would clearly be an advantage if they could, since it would mean that the discrete spectral distributions of the selective pulse in period (Y) is no longer necessary. Instead one could use a short 90° rf pulse to excite the whole spectrum. The localized convolution function Eq. (16b) will still hold in this situation. One might thus proceed as follows: the discrete projection profile $f_m(\omega_{mq})$ i recorded by $G_y$ alone. Then the broadened function $\Gamma_m(\omega_{mq})$ is recorded in $G_y$ and $G_x$. From the above analysis, any localized portion of $\Gamma_m(\omega_{mq})$ is related to $f_m(\omega_{mq})$ by the convolution theorem. A section $\Delta f(\omega_{mq})$ is taken out of the spectrum $f_m(\omega_{mq})$ and a corresponding one for $\Gamma_m(\omega_{mq})$ but $\Delta\Gamma(\omega_{mq})$ should be broader than $\Delta f(\omega_{mq})$ at each side of the section by the broadening of $G_x$. The problem is how to choose the edges. One might try a linear ramp and shape the shoulder contributions in this way. Straightforward application of the convolution theorem thus yields the desired profile. This latter case is only an approximate procedure. The advantage is that all the sample contributes to the observed signals.

The additional constraints implied by condition Eq. (16) for finite widths of selected points are made difficult mainly by the term $\delta\omega_x$ through the large initial selection gradient being switched on. If $G_x$ were switched off during the sampling period, $\delta\omega_x$ would be zero, but of course, there would be no frequency selectivity along $x$. However, there would be spatial selectivity. Provided the initial planes of undisturbed spin magnetization are suitably spaced, it is possible to wind a periodic receiver coil which responds mainly to the selected spins lying within each separated section of the coil. Of course, with $G_x$ switched off, all planes resonate at the same Larmor frequency. If the coils are separate and are each fed into separate receivers and mixers, however, the effective centre frequencies for each plane of spins can be arbitrarily shifted thus allowing frequency resolution or discrimination of the Fourier transformed data as though there were a gradient $G_x$ but with $\delta\omega_x = 0$.

With this scheme it might be appropriate not to deal with more than three or so layers at once. The success of this arrangement depends on the degree of isolation between adjacent coils. The activated sample within one coil section should not produce a significant signal in adjacent coils. For this to hold the intercoil spacing should be approximately equal to the coil radius.

An illustration of such an arrangement is shown in FIG. 8.

One or more such coils as illustrated in FIG. 8 could alone and without the x-axis selective excitation procedure ((X) phase of FIG. 3) give the desired spatial variations of spin density along the x-axis. For one receiver coil, it is necessary to record two dimensional images as described in phases (Y) and (Z) for several positions of the receiver coil with respect to the object being imaged. For a fixed coil system, the object is advanced stepwise through the receiver coil and a two dimensional image recorded for each incremental advance. From the measured (or calculated) spatial response function of the receiver coil, a spatial deconvolution of each picture element along the x-axis is performed and the true spatial variation of spin density along the x-axis thereby deduced. This spatial function may then be convoluted with a rectangular spatial response function to give two dimensional cross sectional distributions of finite thickness.

For a multi-coil receiver array, the number of steps or advances of the object along the x-axis can be substantially reduced thus speeding up the three dimensional imaging process. The total distance through which the object must be advanced for the coil arrangement of FIG. 8 is clearly the coil separation. FIG. 8a shows an alternative receiver coil geometry which allows a closer arrangement of receiver coils and is more suitable to static magnetic field geometries where the main static field B is applied along the long axis of the object rather than at right angles to it. Each reciever coil is a split-saddle geometry coil of thickness T and is shown with its coil axis along Z. The coils are spaced S apart and S may be approximately equal to T. Each coil feeds its own low noise amplifier $A_n$ and mixer $M_n$ with local frequency $\omega_n$. All signals are then combined and fed to the main receiver and detector system. Because the receiver coils can be placed somewhat closer in this arrangement, less movement of the specimen is required along the x-axis in order to record and deconvolute the spatial density variations along the x-axis of each point in the planar image.

In both receiver coil arrangements described above it is presumed that a large orthogonal transmitter coil or coils irradiates the specimens uniformly at least over the active volume of the receiver coil array. Spins in the transmitter coil which receive a substantially reduced r.f. field due to spatial inhomogeneity are assumed to be sufficiently far away from the receiver array so as not to produce a signal.

The apparatus consists of a computer controlled pulse spectrometer, which operates at 15.0 MHz for example. A schematic diagram of the apparatus is shown in FIG. 9. Computer control is effected via the I/O highway of, for example, a Honeywell 316 computer and a further route via an accumulator or A-register. In addition to the normal input/output facility for the computer, a one and two dimensional display which allows sections of the memory core to be interrogated is provided.

The spectrometer consists of two independent r.f. channels; a lower power and a higher power channel, both driven from a common 15 MHz frequency synthesizer.

Low power signals pass through a switched 180° phase modulator, four bit binary attenuator and fixed attenuator $A_1$ to a broad band 10W driver amplifier. The output from this is finally amplified in a 250W linear amplifier. $A_1$ is adjusted so that the r.f. amplitude covers the full linear range of the power amplifier.

In the second high power channel, low level signals pass through a variable phase shifter and gate G which is opened by pulse generator P. Signals from the gate are then amplified up to almost 1 KW.

The two channels are combined and fed to the transmitter coil of the probe. The attenuator $A_2$ is used to control the final power level in the low power channel.

As indicated in FIG. 9, the 180° phase modulator, pulse generator P and binary attenuator are controlled by bit patterns generated in the A-register of the computer.

Nuclear signals from the probe are fed via a low noise pre-amplifier to the receiver where they are phase detected relative to a reference input derived from the frequency synthesizer. The detected signals are then converted to digital form in the analogue-to-digital converter (ADC) and fed into appropriate locations in the computer core for signal averaging and processing.

The probe may consist of a cross coil arrangement as shown in FIG. 10 with the static field B in the direction indicated. The large saddle geometry transmitter coil produces a uniform r.f. field over most of the sample contained within it. For an extended sample as shown there will be regions of the sample which do not receive the full r.f. magnetic field. However, by confining received signals to the second orthogonal coil, which is fairly flat, it will pick up spatially localized signals within about $\pm\frac{1}{2}r$ above and below the coil plane. These regions will thus have received the full r.f. level from the transmitter pulse. Naturally, the receiver coil thickness can be extended to include the desired volume in whole volume imaging. Alternatively, the receiver may comprise several flat coils uniformly (or otherwise) separated along x, as described with reference to FIGS. 8 and 8(a). An added advantage of the cross-coil assembly is receiver protection.

An example of an imaging method embodying the invention is now described. The sample geometry, coil positions and static field are as shown in FIG. 10. Some mineral oil in the form of a cylindrical annulus was taken as a sample. The measured outer diameter of the annulus was 13.7 mm and the inner occlusion 8.1 mm diameter.

The one dimensional projection of the annulus measured in $G_y$ is shown in FIG.11(a). The sample was selectively irradiated with a radiation pattern corresponding to five equally spaced, equal intensity rectangular peaks in the r.f. spectral distribution. That is to say, L = 5, m = 1 and n = 20 (see FIG. 7). The frequency per point $\Delta\omega_p = 855$ rad sec$^{-1}$. The response to this selective irradiation in the gradient $G_y$ is shown in FIG. 11(b). As expected, it is the discrete projection profile. If more lines were included, the continuous projection profile FIG. 11(a) would be traced out. The width of each spike in FIG. 11(b) is 195 Hz. About half of the broadening of these spikes is due to static magnetic field inhomogeneity, the remainder being ascribed to non-linearity of the field gradient coils.

The response to the selective irradiation in $G_y$ but read in $G_y$ and $G_z$ is shown in FIG. 11(c). Each spike of FIG. 11(b) is broadened by the action of the additional field gradient $G_z$ to yield directly, successive cross sectional views through the oil annulus.

The radiation pattern was shifted up in frequency by $\frac{1}{4}$, $\frac{1}{2}$ and $\frac{3}{4}$ of the frequency spacing between adjacent peaks in the r.f. spectral distribution (that is to say by 5, 10 and 15 points in the discrete spectrum). This interlacing procedure gives a four times finer grid resolution across the specimen and allows a visual image to be produced. Such an image can comprise a 20 × 60 array made up from four broadened spectra as in FIG. 11(c). Each broadened spectrum is the result of 128 averages.

In the system described above, a plane (or set of planes) normal to the x axis is initially prepared by selectively saturating all spins above and below the plane (or between the planes) of thickness x. This is done in the period (X). Then a second selective pulse in period (Y) simultaneously irradiates a set of narrow strips (width y) in the plane parallel to the z axis. The free induction decay (FID) signal from this tailored excitation pulse is read in combined gradients $G_x$, $G_y$ and $G_z$ for three dimensional imaging, or for the simpler two dimensional imaging in the plane, just $G_y$ and $G_z$. The whole process of initial selection of the pulses, selective excitation of the strips within the spaces and final read out of the signal can be written as a cycle (X, Y, Z) repeat.

A further variant of the read phase is to either pulse with a train of 180° rf pulses, or periodically reverse the read field gradients so that a series of spin echoes is produced. The object of doing this is to keep the transverse signal (FID) in being for as long as possible so that signal averaging may be performed.

The above system is satisfactory but with certain materials is less effective for the reason set out below relating to problems occurring in the initial preparation phase. If saturation of the spins above and below a slice of thickness $\Delta x$ is considered during the initial selection process, the volume of saturated spins could easily be, for example, 63 times the volume of the undisturbed plane. (That is to say, the entire volume is considered as being divided into 64 slices.) Now if the saturation process is perfect and there is no re-growth of these saturated spins caused by spin-lattice relaxation, the second two phases of the experiment work as predicted. However there will be some re-growth of the initially saturated regions. In addition, the saturation process itself may not be perfect.

Suppose, for example, that only 90% of the magnetization in the saturated regions is destroyed, then at the end of the (X) pulse, there is a slice of undisturbed spins with 1/64 of the total volume (and hence magnetization) but in addition there is a contribution of about 6/64 from all unsaturated spins. These latter spins give an unwanted signal six times that of the slice being scanned. This swamps the desired signal and thus the experiment is ineffective.

For perfect saturation pulses and negligible spin lattice relaxation the method works. However, from the above example it is too dependent on misalignment of the initial selection pulse. For this reason, an alternative procedure is set out below.

The apparatus and theory is as described above. The important difference is the order in which the various selections are performed. The various selection and read phases are now called A, B and C.

(A) In the part A (FIG. 12) the gradient $G_y$ is switched on and the sample selectively irradiated for time $t_a$ to produce a set of undisturbed slices (or planes)

of magnetization normal to the y axis as indicated in FIG. 13. The slice thickness is $\Delta y$ and for simplicity a regular set of slices is taken with grid spacing b. The details of the selection pulse are discussed later. After a further time $t_a$, the disturbed spins decay producing a FID signal (note that if this signal is sampled and Fourier transformed, it yields the projection profile of the saturated regions of the sample and could be used for alignment purposes).

(B) In phase B $G_x$ alone is switched on and a second multiple slit irradiation pattern selectively excites the spins in a series of slices normal to the x axis. These are indicated in FIG. 14 as the cross-hatched regions, and for a cylindrical sample as sketched, are a series of discs of thickness $\Delta x$ spaced apart.

(C) In phase C the signal (FID) following the B selection is observed in all three gradients $G_x$, $G_y$ and $G_z$. (For the single plane imaging version, only $G_y$ and $G_z$ are required in the read period.) Periodic reversals of the applied gradients again are used to make the transverse signal persist for signal averaging purposes. The timing of the gradient reversals (or the alternative 180° rf pulses) is as described in the previous method.

To understand the advantages of this method suppose that in the initial selection phase A, the spins between the undisturbed planes (FIG. 13) are not quite saturated. Let it be again assumed that 90% of the magnetization is destroyed and 10% remains through either imperfect pulses or spin-lattice relaxation effects,. Of course, the undisturbed planes have 100% relative magnetization by definition.

When all transients have died away (in the second period $t_a$) and the B selection is performed, only the spins within the discs (FIG. 14) or single disc (FIG. 15) are excited. If the B excitation pulse is not perfect, a slightly smaller signal is seen. Of course, there will be a signal contribution from both the previously undisturbed and disturbed strips of magnetization within the disc, but the disturbed ("saturated") strips will contribute only 10% signal amplitude of a total possible 90% signal in the plane that is to say 9%. This appears as a broad "baseline" signal. The desired signal contribution constitutes only 10% of the total possible signal and sits on top of the 9% unwanted signal. Since the "baseline" profile is known experimentally, it can be substracted, or accounted for.

The assumptions in this example illustrate the lower sensitivity of this imaging method to imperfections in the saturation pulses.

Figure 16A:
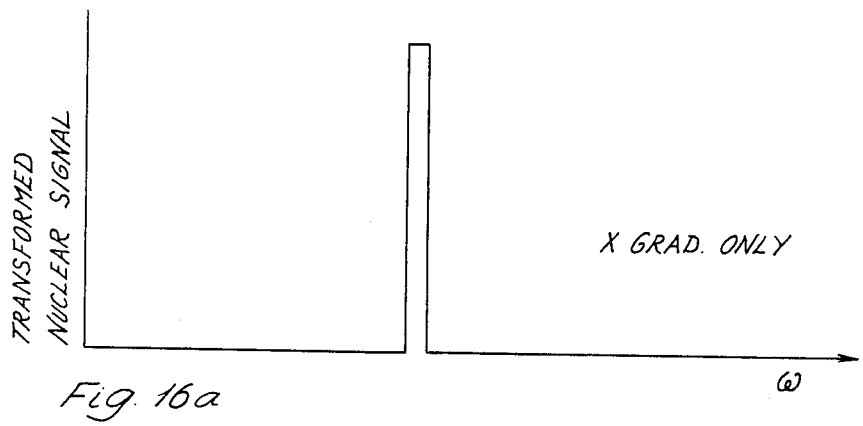
Figure 16B:
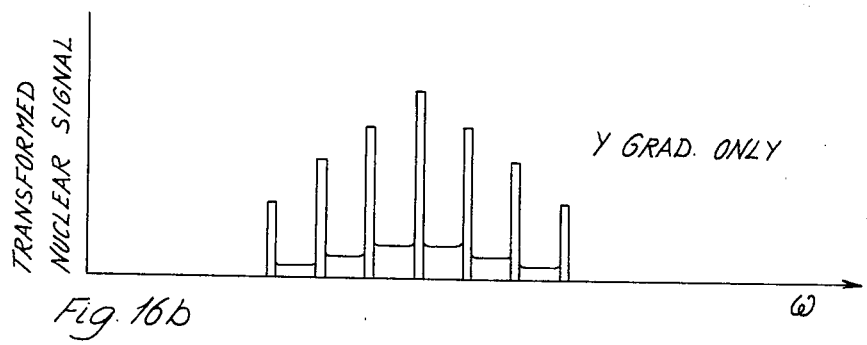

The expected Fourier transformation signals for a cylindrical sample of homogeneously distributed spins prepared as in FIG. 15 by the selective irradiation procedure is shown at (e), (b) and (c) in FIG. 16. The effect of misalignment of the initial A selective saturation pulse is also indicated therein. The three diagrams of FIG. 16 are drawn for readout of a single disc of magnetization for different read gradients. In FIG. 16(a) there is shown a signal obtained with a read gradient equal to $G_x$ only and shows a single line from all the undifferentiated spins within the disc. If read gradient $G_x$ is replaced by a gradient $G_y$ then the single line is broadened into a discrete profile as shown in FIG. 16(b) corresponding to the projection of the spin density distribution of the disc along the Y axis. The discrete structure is produced by the initial selective saturation pulse and if the saturation is not perfect it will give rise to a non-zero signal contribution as shown between the discrete spikes.

Figure 16C:
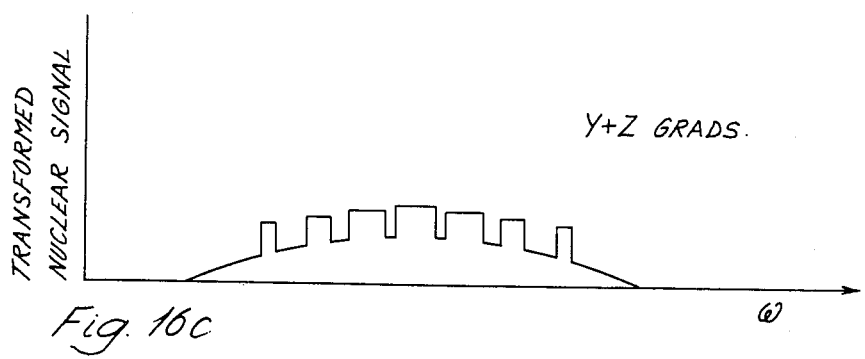

FIG. 16(c) shows the expected signal on application of read gradients $G_y$ and $G_z$ as in the case of a full single plane imaging experiment. The addition of the $G_z$ gradient broadens each line of the discrete spectrum of FIG. 16(b) as well as the small unwanted baseline contribution. Ideally the profile of each broadened line is rectangular and of constant height and sits on the broadened base-line signal to give a direct visual picture of successive cross sectional views through the disc. The broadened baseline profile is the projection of the object in combined gradients $G_y$ and $G_z$ and can be measured in a separate experiment and subtracted.

The A irradiation pattern is as shown in FIG. 17a where small gaps of zero $H_1$ intensity correspond to the unirradiated and hence undisturbed magnetization in FIG. 13. However, it is technically more convenient to produce a complementary radiation pattern, FIG. 17b, but this does just the opposite of what is required. That is to say, it disturbs the narrow strips that it is desired to leave undisturbed.

The procedure, therefore, is to pulse with r.f. having the spectral distribution pattern of FIG. 17b and follow immediately with a short 90° rf pulse whose rf carrier phase is shifted by 180°. The nett effect is thus to tip the magnetization in the narrow strips back along the x axis, while the undisturbed magnetization in the wider strips is tipped backwards by 90° into the x-y plane of the rotating reference frame. The final state of the undisturbed spins is the same as would be achieved by using a pulse with the spectral distributions of FIG. 17b.

FIG. 12 shows that following the B selection pulse, the FID decays but can be refocussed into an echo by either reversal of all read gradients or by keeping the gradient steady and applying a 180° rf pulse. The peak echo amplitude decays with time constant $T_2$. Thus if $T_2 > t_b$, many field gradient reversals can be made and many echoes can be produced. These echoes can be suitably co-added to improve the signal/noise ratio over the single FID signal.

This echo averaging process described here and in the aforementioned patent application allows the transverse decay signal in effect, to persist for a time $T_2$ or so. If $T_1 = T_2$ there is no wait period required between the end of signal averaging and the repeat of the A phase in the cycle.

In biological materials, however, $T_2$ can be less than $T_1$ and in this case time could be wasted waiting for the spin system to repolarize. The major application of spin imaging is likely to be in biology and medicine where the speed of imaging is of considerable importance, and therefore modifications are introduced to the cycle of FIG. 12 to get around the problem caused by different relaxation times.

The modified cycle is shown in FIG. 18 and should run continuously. The A and B phases are the same as indicated in FIG. 12. The read phase C is similar to that described previously, and although one FID and one half-spin-echo are shown, this phase could be extended from $2t_c$ to $2nt_c$ (where n is integer) to include more echoes.

The new feature of the cycle is the store phase D. As indicated, the refocussed signal at a spin echo peak is switched back to the equilibrium position by the same selective excitation pulse $P_b$ but with a 180° rf carrier phase shift denoted $P_b^{180}$. Any magnetization loss in the read and store periods can be recovered in the A period. Of course, the recovery of magnetization may not exactly balance any losses, so that the initial FID signal amplitude may, after a number of cycles, approach a new equilibrium magnetization different to the static equilibrium value. The important point is that the read signal is substantially independent of both $T_1$ and $T_2$.

In a given cycle, the fraction of time spent reading the signal can be increased by including more echoes. The maximum time $2nt_c$ is limited to $T_2$ but it is preferable to keep $n$ of the order of one or two because of spin-lattice relaxation losses in the signal amplitude.

The addition of a store phase D in the cycle is similar to the steady state free precession method of Carr (H. Y. Carr, Phys. Rev. 112, 1693 (1958).

A number of alternative, and equivalent excitation pulse arrangements are also shown which use 180° rf pulses to refocus the spin echo (NB. the gradient reversals are not required in this case). Notice that the 180° carrier phase shift of the second selective pulse $P_b$ is still required. The disadvantage of this arrangement is that more rf power is required, but this could be outweighed in a practical system by its greater simplicity to achieve a result.

Using rf pulses to refocus (without gradient reversals) for the read phase is similar to the driven equilibrium free precession (DEFT) method of signal enhancement described by E. D. Becker, J. A. Ferretti and T. C. Farrar in J. Amer. Chem. Soc. 91 7784 (1969). A number of modifications to this method proposed by J. S. Waugh in J. Mol. Spectroscopy 35 298 (1970) are also incorporated in FIG. 18. These modifications are to the carrier phasing of the 180° refocussing pulses, with respect to the $P_b$ selective excitation pulse. Thus strictly speaking, the 180°, 180°$_{90}$ and 180°$_{180}$ pulses referred to in FIG. 18 should really be selective excitation pulses as well with the same sharp spectral profile as $P_b^{\cdot}$ and $P_b^{180}$. The object of introducing these apparent complications in the rf carrier phasing is to automatically compensate the cycle for inperfections due to rf inhomogeneity. If parts of the specimen do not receive an exact 180° rf pulse, then repeated application of the cycle will in general lead to a deterioration and perhaps complete loss of the signal. For proper compensation, it is better to have $n=2$ thus producing two spin echoes between $P_b^{\cdot}$ and $p_b^{180}$. In the pulse version, refocussing can be achieved by using either 180$_{90}$ rf pulses for all $n$ or 180$_o$ ($n$ odd) and 180$_{180}$ ($n$ even).

There may be substantial spin dephasing during the long selective excitation pulses. Most of this should be refocussed in the present pulse schemes but it may be necessary to make further minor adjustments in the pulse phasing and pulse timing in order to compensate for any signal loss or degradation.

FIG. 19 shows a simpler version of the imaging system for producing images of a single plane (FIG. 15). (For multiplane operation, $G_x$ would have to be left on in the read phase $t_c$). This cycle works as follows: Repetitive selective excitation pulses $P_b$ can be made to produce a non-zero FID in a quasi-equilibrium state, even when the repetition period is a lot less than the spin lattice relaxation time $T_1$. This effect has been described by Carr and more recently b R. R. Ernst and W. A. Anderson, Rev. Sci. Instrum. 37 93 (1966) and by R. Freeman and H. D. W. Hill, J. Mag. Res. 4, 366 (1971), and is referred to as steady state free precession (SSFP). SSFP works for selective irradiation pulses and in switched magnetic field gradients.

As stated above, an advantage of combining the present imaging method with SSFP is that the image produced is substantially independent of both $T_1$ and $T_2$.

It is also possible to approximate the complementary rf spectral distribution of FIG. 17b by a train of equally spaced short rf pulses. The discrete frequency distribution of such a pulse train has width inversely proportional to pulse duration, a periodicity inversely proportional to the pulse repetition period and a discrete time width inversely proportional to the pulse train length. The spectral distribution may be reasonably approximated as of constant amplitude over a restricted frequency range. However, generating a pulse spectrum wider than required represents a considerable waste of rf power in the unwanted sidebands and is best avoided particularly when irradiating live specimens.

The signal to noise ratio of received signals depends on the noise voltage generated in the receiver coils. Thus using a cryogenic pre-amplifier or otherwise, signal to noise improvements may be obtained by reducing the temperature of the probe (or just the receiver coil). This can be done by immersing the coil and damping resistor in liquid nitrogen or liquid helium.

A useful measure of the performance of a particular imaging scheme is the imaging time $T_i$. This is defined as the total time required to produce a picture to a given resolution and signal/noise ratio. The imaging time clearly depends on the imaging method, and indeed, even for the same method, can vary depending on precisely how the data obtained is processed.

For a given three dimensional spin system, there is a limited amount of information which has to be read out, processed and displayed. Quite irrespective of the imaging method used to access this information, there are a number of fundamental constraints which allow an ideal imaging time to be calculated.

Let the imaging volume field, supposed to be a cube, be divided into $m^3$ volume elements. For each volume element there is a corresponding picture element in the image field and suppose that only the spins in a fraction of each volume element contribute to the observed signal for each picture point. The signal/noise ratio per picture point, $R_p$, is given by $$R_p = AF(Q\omega_o^3 \beta V/B)^{\frac{1}{2}} = R_{po}\sqrt{\beta} \qquad (17)$$

where V is the total volume of the sample assumed to completely fill the resonant receiver coil with a distribution of mobile spins, and $f = 1/m3$, is the filling factor for one picture volume element. The quantities Q, $\omega_o$, and B are repectively the receiver coil quality factor, the Larmor angular frequency of the spins and the band width per picture point. The constant A embodies the spin susceptibility, receiver temperature and noise figure and a coil geometry factor.

It is now assumed that data from $m^3$ volume elements can be collected simultaneously, but in such a way as to preserve the spatial localization of each element. That is to say, a planar or multi-planar imaging system such as that described in FIG. 18, for example, is considered.

The imaging time $T_i$ is given quite generally by $$T_i = N_A T_c + D_{lmn} \qquad (18)$$

where $N_A$ is the number of averages of the imaging cycle necessary to achieve the desired signal/noise ratio R and $D_{lmn}$ is the time required to Fourier transform the data into $l \times m \times n$ picture points. The cycle period $T_c$ (see FIG. 18) is given by $$T_c = 2t_a + 2t_b + 2nt_c + T_d \qquad (19)$$

in which $2nt_c$ is the data collection time, $t_a$ and $t_b$ are selective excitation pulse lengths and $T_d$ a delay which incorporates the time to compute the Fourier transforms of the selective irradiation excitation spectra. The bandwidth per point B of equation (17) can be expressed in terms of a single data collection interval as $$B = 2\pi/t_c \qquad (20)$$

The signal/noise ratio enhancement produced by averaging the signal $2n$ $N_A$ times is given by $$R = R_p\sqrt{2nN_A} \qquad (21)$$

from equations (12) and (18) it is clear theoretically that the shortest imaging time $T_{i\ min}$ is achieved when the signal from all the spins in the specimen is sampled all of the time, i.e. when $\beta = 1$ and $T_c = 2nt_c$. Practical imaging systems, which inevitably fall short of this ideal, can, however, be simply compared with it by introducing an imaging efficiency $n_i$ defined by $$n_i = T_{imin}/T_i \qquad (22)$$

which, from equations (17), (18) and (19), reduces to $$n_i = \alpha\beta \qquad (23)$$

where $\alpha = 2nt_c/T_c$. The Fourier transformation time, which depends on the type of computing facility available, has been ignored in this calculation.

In the selective irradiation scheme for planar imaging, some space must be allowed between adjacent line elements. This means that $\beta$ cannot be unity unless interlacing of the picture is used. The nature of the selective pulses also means that $\alpha$ cannot equal unity. This is discussed below. Realistic values of $\alpha$ and $\beta$ for single plane imaging as described in this paper would $\alpha = \frac{1}{2}$ and $\beta = \theta$ yielding an efficiency $\eta_i = 12\%$.

It is of interest to compare the imaging times for single plane and line-scan imaging under optimum conditions for equal singal/noise ratio and resolution. If we consider pictures comprising equally spaced grids of m lines in both cases, then the necessary gaps between adjacent lines in planar imaging mean in general that $\beta^l$ can be greater than $\beta^p$ where the superscripts $l$ and $p$ used here and later refer spectively to line scan and planar imaging.

An alternative way of leaving unfilled gaps in the planar image is the idea of interlacing already discussed and used to produce NMR images. In this case it is straightforward to arrange that $\beta^l = \beta^p$ corresponding to the final fine grid required for a given picture resolution. However, the final planar image is then made up of an interlace of $i$ (integer) coarser grid planar images produced by selective irradiation with $m/i$ lines. The necessary gap between adjacent rows in each coarse planar image is thus created by the missing $(i - 1)$ lines. In this case and from equations (17), (18) and (21) we obtain for single plane imaging of $m^2$ points in an i-fold interlace $$T_i^p = iN_A T_c^p/\beta^p + iD_{mm/i^p} \qquad (24)$$

Line-scanning the same data in $m$ rows with $m$ points per row yields an imaging time (using the same receiver and bandwidth per point)

$$T_i^l = mN_A T_c^l/\beta^l + mD_m^l \qquad (25)$$

If we take $T_c^p = T_c^l$, $\beta^p = \beta^l$ and discard the Fourier transformation times then the imaging time ratio is $$T_i^l/T_i^p = m/i \qquad (26)$$

Of course account of the Fourier transformation times may be made using the exact expressions (24) and (23). Using fast computers, Fourier transformation of data into an array of 128 × 128 data points can be performed in about 3.5 seconds. When the first term in equation (24) is comparable to $iD_{mm/i^p}$, then if $iD_{mm/i^p} \simeq mD_m^l$, the imaging time ratio becomes for large $m$ $$T_i^l/T_i^p \simeq m/2i \qquad (27)$$

which still represents a substantial improvement in speed for planar imaging over line-scanning. Taking $m = 128$ and a four-fold interlace, equation (27) shows that in a typical situation planar imaging is 16 times faster than line-scanning. Line-scanning under these conditions yields an imaging efficiency $\eta_i$ of only 0.24%.

I claim:

1. A method of obtaining a nuclear magnetic resonance spin density distribution of a sample which comprises maintaining a static magnetic field along one axis, applying a first magnetic field gradient to said static magnetic field to cause said field to vary along an axis selected from said one axis and an axis orthogonal thereto at the same time applying a selective excitation pulse so as to select at least one planar layer in the sample normal to the selected axis, removing said first magnetic field gradient and applying a second magnetic field gradient to said static magnetic field to cause said field to vary along an axis which is orthogonal to said selected axis and at the same time applying a selective excitation pulse to excite a series of strips in said at least one selected layer, and then simultaneously applying magnetic field gradients to said magnetic field to cause said field to vary in at least two of said orthogonal directions such that each point of the selected strips is subjected to a resultant magnetic field of amplitude unique to that point, and reading out the resulting free induction decay (FID) signal from said strips.

2. The method as claimed in claim 1 in which said first magnetic field gradient causes the static magnetic field to vary along its own axis.

3. The method as claimed in claim 1 in which said first magnetic field gradient causes the static magnetic field to vary along an axis orthogonal to the axis of the static magnetic field and the second magnetic field gradient causes the static magnetic field to vary along its own axis.

4. The method as claimed in claim 1 and including further steps in which the said simultaneously applied magnetic field gradients are periodically reversed to produce spin echoes.

5. The method as claimed in claim 1 and including the application of successive 180° $rf$ pulses to reverse the spins while maintaining said simultaneously applied magnetic field gradients so as to produce spin echoes.

6. The method as claimed in claim 1 in which the simultaneously applied magnetic field gradients cause the static mangetic field to vary in three orthogonal directions.

7. The method as claimed in claim 1 in which a plurality of planar layers are selected and the simultaneously applied magnetic field gradients cause the static magnetic field to vary in two directions orthogonal to its own direction and in which the resulting FID signals are read out individually from each of said selected layers.

8. The method as claimed in claim 1 and including the further step of Fourier transformation of said FID signal to yield a signal representing the magnetic resonance spin density distribution in the said strips.

9. The method as claimed in claim 1 in which the selective excitation pulses comprise a train of equally spaced short rf pulses followed by a short 90° rf pulse whose phase is shifted 180° from the phase of the pulse train.

* * * * *